United States Patent [19]
Odinot

[11] Patent Number: 5,589,787
[45] Date of Patent: Dec. 31, 1996

[54] CELL FOR SHIFT REGISTER

[75] Inventor: Charles Odinot, La Tronche, France

[73] Assignee: SGS-Thomson Microelectronics, S.A., Gentilly, France

[21] Appl. No.: 443,808

[22] Filed: May 18, 1995

[30] Foreign Application Priority Data

May 20, 1994 [FR] France .................................. 94 06491

[51] Int. Cl.$^6$ .................................................. H03K 3/289
[52] U.S. Cl. ................................ 327/202; 377/72; 377/78
[58] Field of Search .......................... 377/72, 78; 327/202

[56] References Cited

U.S. PATENT DOCUMENTS

| 4,701,921 | 10/1987 | Powell et al. ............................. 371/25 |
| 4,722,049 | 1/1988  | Lahti ....................................... 364/200 |
| 4,872,137 | 10/1989 | Jennings .................................. 364/900 |
| 4,970,690 | 11/1990 | Sherman .............................. 365/189.02 |
| 5,202,625 | 4/1993  | Farwell ................................ 324/158 R |
| 5,220,281 | 6/1993  | Matsuki et al. ..................... 324/158 R |

OTHER PUBLICATIONS

G. J. Myers, Digital system design with LSI bit–slice logic, 1980, pp. 230–239, John Wiley & Sons, Inc., US p. 237, lines 1–4.

*Primary Examiner*—Margaret Rose Wambach
*Attorney, Agent, or Firm*—Robert Groover; Betty Formby

[57] ABSTRACT

A cell for a shift register comprises an input and an output connected to the line with which it is associated, the cell being parallel-connected on this line, and the output of the cell being separated from the rest of this cell by a tristate buffer circuit. This cell is made in such a way that the state of the inputs of the flip-flop circuits of the cell is never floating when these cells are insulated from the inputs of the cell.

29 Claims, 6 Drawing Sheets

5,589,787

CELL FOR SHIFT REGISTER

BACKGROUND OF THE INVENTION

1. Field of the Invention

The present invention relates to a cell for a shift register. It is especially useful in methods for testing the operation of applications specific integrated circuits.

Applications specific integrated circuits (ASIC) are integrated circuits made on a single chip at the user's request. Certain applications specific integrated circuits have a central processing unit (for example a dedicated signal processor or DSP in the case of an integrated circuit dedicated to signal processing) associated with a certain number of devices that depends on the application of the circuit: memories, interfaces, etc.

The user gives the manufacturer the application program of the circuit and information on the desired circuit configuration such as the type and volume of the memories or the nature of the interface devices of the circuit. The integrated circuit is then made on a chip by associating specific devices with the central processing unit, these specific devices being notably a read-only memory (ROM) containing the application program.

For the manufacturer's test, there is a known way of making the central processing unit carry out an automatic testing program stored in the program memory of the circuit. Since the configurations depend on the user's request, it is not possible to plan for a single testing program.

To test integrated circuits, there is also a known way, described for example in EP-0 358 376, of using a shift register formed by the series connection of a set of elementary cells mounted on the input/output lines of the integrated circuit. Each cell can carry out the injection, on its respective line, of a value introduced serially through the shift register, and sample the value of the signal conveyed by this line with a view to a serial reading through the shift register. It is thus possible to inject test signals into the integrated circuit and check the behavior of the circuit in response to these signals.

One drawback of this system is that it does not enable direct access to the internal buses of the circuit used for communications between the central processing unit and the devices depending on the application, unless the number of cells is considerably increased. This adversely affects the compactness of the circuit and the speed of the shift register.

There is a known way, described for example in EP-0 578 540, of using a shift register formed by connecting cells mounted on the input/output lines of the central processing unit. This makes it possible to test both the central processing unit and the associated devices with a small number of cells. It also enables the testing of a large number of possible configurations without modifying the shift register.

Typically, a cell used to take position in a shift register is series-connected on a line (a line providing access to a central processing unit for example) and series-connected with other cells connected to other lines. Physically, said line will therefore be separated into two parts. For example, if such a cell is mounted on a line of a bus between a central processing unit and a peripheral, a part of the line will go from the central processing unit to the cell and tile other part of the line will go from the cell to the peripheral. A cell such as this therefore has an input, called a parallel input, connected to one part of the line, an output, called a parallel output, connected to the other part of the line (for the injection, into this part of the line, of a value transmitted from the exterior through the other cells or in order to give the value present at the parallel input, in which case the cell is transparent), a series input and a series output to enable the gradual shifting, in the shift register in which the cell is placed, of the values to be injected or the sampled values.

It can therefore be seen that the cells could be one-directional if they are mounted on lines having one defined direction of signal propagation or bi-directional if they are mounted on lines used to transmit signals in both directions, in which case the parallel inputs and outputs are actually inputs/outputs.

Typically, the one-directional cells have a memorization or storage flip-flop (for example a master-slave type of delay circuit) capable of receiving, at input, either the value of the signal present at the parallel input (in the case of a sampling), or at the series input (in the case of an injection or a shift), the output of this storage flip-flop being connected to the series output (to enable the shift from one cell to the other). Furthermore, the one-directional circuit also comprise, conventionally, a multiplexer having one input connected to the parallel input and one input connected to the output of the storage flip-flop, if necessary by a latch and an output connected to the parallel output, this multiplexer enabling the injection of a value into the line or making it possible to render the cell transparent to the line (the parallel input and output being then connected). These different means are controlled by command signals coming either from an external control block or from an internal control block receiving external command signals, the test procedures being of course controlled from outside the circuit.

In the case of the bidirectional cells, the composition of the cells is identical except that they include an additional multiplexer having one input connected to the parallel output (which behaves as an input/output), one input connected to the output of the storage flip-flop (possibly by a latch) and one output connected to the parallel input (which behaves as an input/output). Furthermore, it is necessary to provide for a command and an additional input in the multiplexing means needed to enable the giving, at the input of the storage flip-flop, of either the value of the signal present at the series input (in the event of a shift) or the value of one of the signals present at the parallel input and output (in the event of sampling).

The cells conventionally used have several drawbacks:

they induce delays, of 0.5 to 2 nanoseconds depending on the technology used, in the propagation of a signal in the line, owing to the crossing of at least one multiplexer, they raise a problem of synchronization inasmuch as the signals present in the lines depend on clocks internal to the circuit while the command signals of a shift register used to shift sampled values depend on a clock external to the circuits since, in practice, the values to be injected or the values sampled are given by or to testing devices external to the circuits to be tested. This therefore makes it necessary either to produce shift command signals from signals external to the circuit, which are synchronized with the internal clock signals, or to stop the internal clock signals so as to ensure the stability of the values of the signals present at the lines when it is desired to sample them. The first approach has the drawback of requiring additional resources and hence of increasing the size and power consumption of the circuits while the second approach has the drawback of making it necessary to interrupt the operation of the circuits at each sampling operation, they do not guarantee the internal logic state of the cell, for example the cell present at the output of the storage flip-flop where possible leaks may as the case may be cause deterioration in this signal, there being no loop designed to hold this signal, they raise a problem of consumption at the input of the storage flip-flops or latches, when these circuits are off (input insulated from the output), for they are then insulated and may be subject to capacitive or dynamic type leaks for example at the substrates of input transistors.

SUMMARY OF THE INVENTION

In view of the above, it is an aim of the present invention to propose a cell that induces no delays in the line to which it is connected.

The invention thus proposes a cell for a shift register designed for the injection, into a transmission line, of a binary value or for the sampling of the value of the signal present in said line, this cell comprising:

a parallel input connected to the line to receive a parallel input signal, a parallel output connected to the line to give a parallel output signal, a series input to receive a series input signal to be shifted into a following cell or to be injected into the line, a series output to give a series output signal to a series input of a following cell, wherein the parallel input and the parallel output are connected and wherein the parallel output is separated from the rest of the cell by a tristate buffer circuit.

Thus, in the invention, there is provision for making a cell parallel-mounted on its line and provided with means to insulate the parallel output of the cell so that the signal present in the line can evolve, if necessary, independently of the cell.

Another aim of the invention is to propose a cell having storage capacities so as to be capable of sampling the value of the signal present in the line without stopping the operation of the circuit, and without making it necessary to synchronize the external shift clocks with the internal clocks of the circuit.

In a preferred version, the cell will have a latch with one input receiving the parallel input signal.

Another aim of the invention is to propose a cell that can be used to ensure the state of the signals present at input and at output of the flip-flops of the cell and, consequently, to minimize the consumption of this cell.

Advantageously, the input of the latch will be connected to the output of a multiplexer, this multiplexer having one input connected to the parallel input and one input connected to the output of the latch.

Another aim of the invention is to propose one-directional or bidirectional type cells integrating the capacities, as defined here above, of storage and of holding the input state of the flip-flop.

BRIEF DESCRIPTION OF THE DRAWINGS

Other features and advantages of the invention shall appear from the following description of a preferred and non-restrictive exemplary embodiment, made with reference to the appended drawings, wherein.

MORE DETAILED DESCRIPTION

Figure 1:
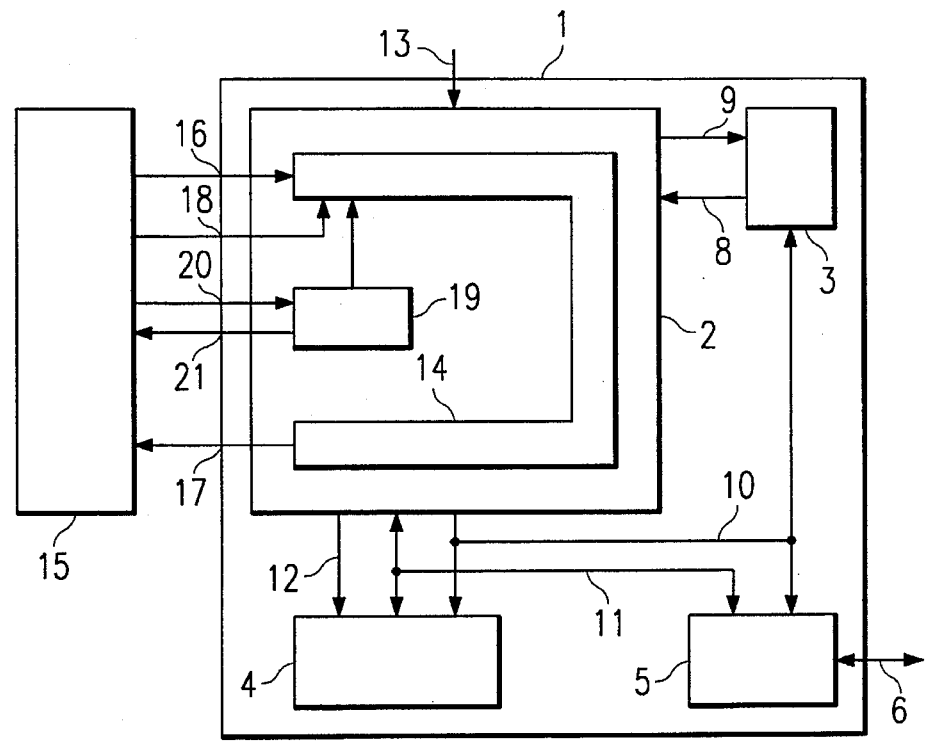
FIG. 1 is a drawing of an integrated circuit implementing a shift register.

Referring to FIG. 1, an integrated circuit 1, made on a silicon chip for example, has a central processing unit 2 and a certain number of devices 3, 4, 5, depending on the application of the integrated circuit. The devices associated with the central processing unit 2 comprise, for example, a read-only program memory 3 (ROM), a random-access data memory 4 (RAM) and one or more interface devices represented schematically by the unit 5. These interface devices are connected to primary ports 6 of the circuit 1 enabling the exchange of analog or digital signals with the environment of the circuit 1.

The central processing unit is connected to the program memory 3 in a standard way by an instructions bus 8, an instructions address bus 9 and lines of a command output bus 10 enabling the reading of the program instructions in the memory 3 with a view to carrying them out. Similarly, the central processing unit 2 is connected to the devices 4, 5 by a bidirectional data bus 11, a data address bus 12 and lines of the command output bus 10, enabling the central unit 2 to exchange data elements (transmission or reception) with the devices 4, 5. The central processing unit 2 could also have a command input bus 13 enabling the reception of the external command signals.

In the exemplary application described, the central processing unit 2 is provided with a shift register 14. This shift register 14, which is of the boundary scan type (see EP-A-0 358 376), has a set of elementary cells series-connected and each mounted on a respective line conveying a binary signal from the integrated circuit 1. More specifically, the cells are mounted on lines corresponding to access lines to the central processing unit: instructions bus 8, command input bus 13, data bus 11, instructions address bus 9, etc.

To be tested, the integrated circuit 1 is connected to a testing device 150 To make this link, the circuit 1 has:

a terminal 16 that corresponds co the series data input of the shift register 14, a terminal 17 corresponding co the series data output of the shift register 14, terminals collectively designated by the reference 18 to address command signals to all the cells of the shift register 14, terminals collectively designated by the reference 20 to address selection binary signals to a control unit 19, and terminals collectively designated by the reference 21, for which the test control unit 21 can address binary signals to the test device 15.

The circuit 1 shall not be described any further, since it schematically represents an exemplary use of a shift register. Reference could be made for fuller details for example to EP-0 578 540 which gives a detailed description of a central processing unit as described here above.

Figure 2:
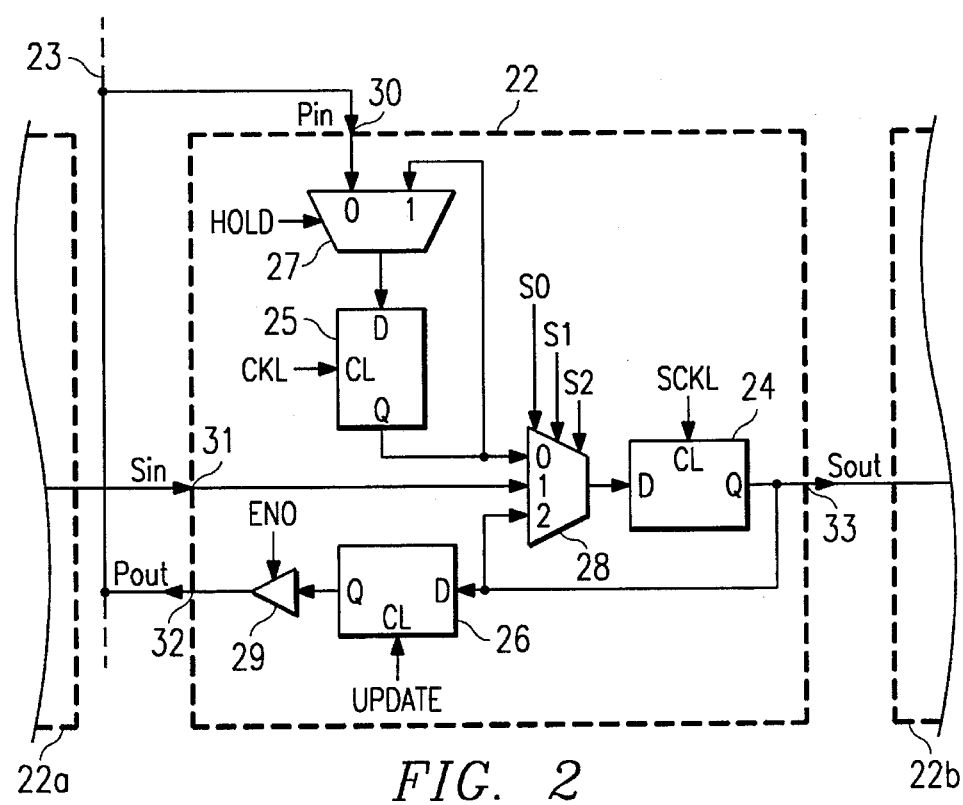
FIG. 2 is a drawing of a cell parallel-connected on a line and made according to the invention.
Figure 3:
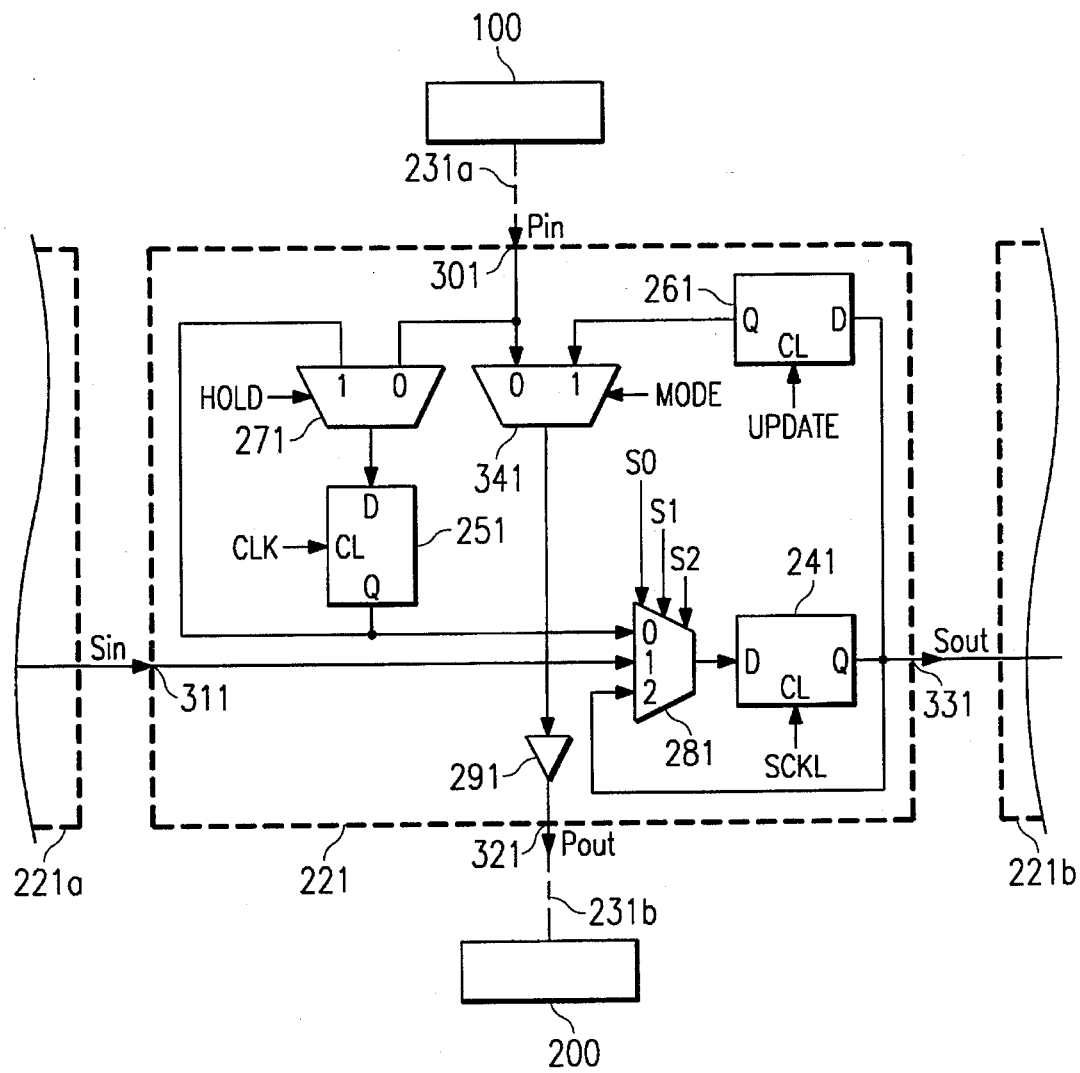
FIGS. 3, 4, 5, 6 and 7 are drawings of cells series-connected on the lines.
Figure 5:
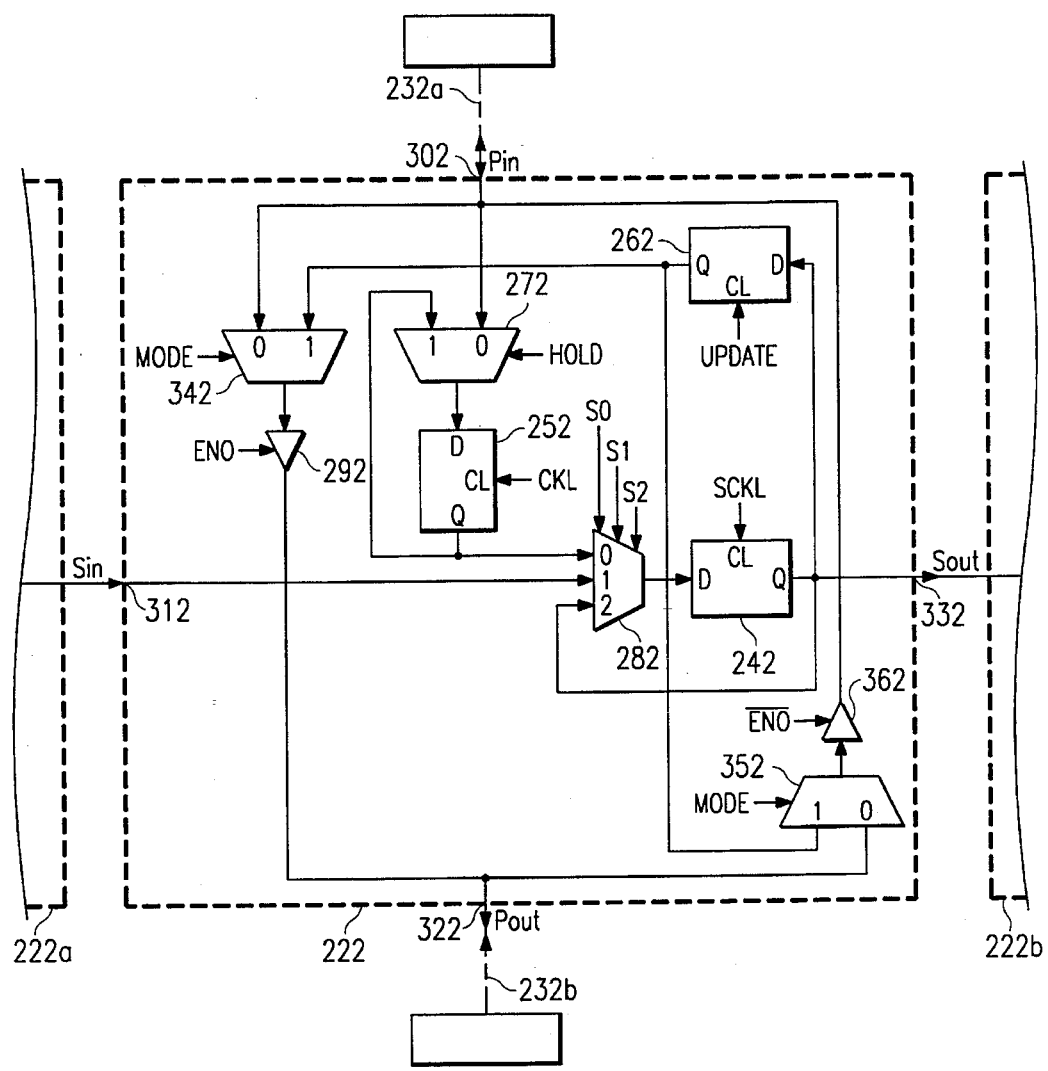

The elementary cells of a shift register may be classified under three types:

firstly, so-called bus type cells illustrated by FIG. 2, designed to be connected to bidirectional or one-directional lines such as those of the bidirectional data bus 11 or the instruction address bus 9, and placed in parallel with respect to these lines, secondly, so-called one-directional cells, illustrated by FIGS. 3 and 5, designed to be connected to one-directional lines, such as those of the instruction address bus 9, and placed in series on these lines, thirdly, so-called bidirectional cells illustrated by the figures, designed to be connected to bidirectional lines as in the case of the bus type cells, but placed in series on these lines similarly to the one-directional cells.

The principle of the one-directional and bidirectional cells is known. The bus type cell is the main object of this invention.

FIG. 2 illustrates a bus type cell 22, parallel connected on a line 23, for example a line providing access to the central processing unit 2. This cell 22 has a storage flip-flop 24 (for example of the master-slave delay type), a first latch 25, a second latch 26, a first two-input multiplexer 27, a second three-input multiplexer 28 and a tristate buffer circuit 29.

A parallel input 30 of the cell 22 receives the binary signal Pin conveyed by the line 23. This input 30 is connected to a 0 input of the first multiplexer 27.

A series input 31 receives a binary signal Sin coming from the previous cell 22a of the shift register 14 or from the input terminal 16 of the shift register 14. This series input 31 is connected to an input 1 of the second multiplexer 28.

A parallel output 32 is connected to the line 23 and enables the injection of a value into this line. The signal present at this parallel output will be referenced Pout.

A series output 33 is connected to the series input of the following cell 22b or to the output terminal 17 of the register 14 if it is the last cell of the register. The signal present at the series output 33 shall be called Sout.

The first multiplexer 27 has an output connected to the input of the first latch 25. This latch 25 has its output connected firstly to a 0 input of the second multiplexer 28 and secondly to a second 1 input of the first multiplexer 27.

The second multiplexer 28 has an output connected to the input of the storage flip-flop 24. This flip-flop 24 has its output connected to the series output 33, to an input 2 of the second multiplexer 28 and to the input of the second latch 26.

The second latch 26 has its output connected to the input of the tristate buffer circuit 29 whose output is connected to the parallel output 32.

The first multiplexer 27 receives a logic command HOLD enabling the selective connection of the input of the first latch 25 to the parallel input 30 or to the output of this same flip-flop. Thus, if HOLD=0, the value of the signal Pin present in the line 23 in the latch 25 could be sampled. If HOLD=1, the states of the input and of the output of this flip-flop will be kept in a permanent stable state.

The first latch 25 receives a command logic signal CKL so that, at its output, it latches the value of the signal present at its input to the trailing edge of CKL for example.

In practice, the integrated circuits have their operation synchronized by a basic clock signal CLOCK formed, for example, by means of a quartz or an oscillating circuit. All the changes in logic states in the lines (data bus, address bus, etc.) produced by devices internal to such circuits are liable to occur only on the leading or trailing edges of this type of clock signal. Consequently, it can always be known whether a change in state on a given line, produced by an internal device, can occur only on the trailing edge or only on the leading edge of this basic clock signal CLOCK.

If it is necessary to be certain about the stability of the value of the signal Pin when it is stored in the first latch 25, then it is enough to choose a signal CKL such that (assuming that the latching is with respect to the trailing edge of CLK):

CKL=CLOCK if Pin can change its state only on the leading edge of CLOCK,

CKL=/CLOCK if Pin can change its state only on the trailing edge of CLOCK.

Secondly, in the former (or latter) case, the signal HOLD chosen will be one that goes to 0 for example on a leading (or trailing) edge of CLOCK and goes back to 1 on the next leading (or trailing) edge of CLOCK.

To enable a sampling of the value of the signal Pin, it is not necessary for the logic signal CKL itself to oscillate the rate of the basic clock signal. It is enough to be certain that, when a sampling is to be done, the value of the signal Pin cannot change. Depending on the lines, it is possible to give the cells command signals for the first latch that are different and suited to the type of edge on which the change in state may occur in these lines.

This assembly has three advantages:

it is possible to sample the values of the signals present in the lines without stopping the operation of the circuit in order to fix the state of these signals, the sampled values are stored in the latch without any risk of drift since, irrespectively of the state of the command signal CKL, when the input of the latch 25 is insulated from the parallel input 30 (HOLD=1), the input and the output of the flip-flop are in one and the same stable state. It is therefore possible, by means of the shift register 14, to recover the sampled values when desired, and the risks of increased consumption due to possible leaks at the input of the latch 25 are averted since its state is stable and not floating.

The second multiplexer 28 receives three logic command signals S0, S1, S2 to selectively provide, at the output of this multiplexer, either the signal present at the output of the first latch 25 or the signal present at the series input 31, or the signal present at the series output 33. It shall be assumed that these signals enable the connection of the input corresponding to them to the output if they are at 1, with of course one signal at a time being at 1.

Thus:

if S0=1, then the value given by the first latch can be transferred to the storage flip-flop 24 and it is possible to proceed in this way until the transfer of the value sampled on line 23 into the next cell 22b, if S1=1, then it is possible to make a transfer, into the storage flip-flop 24, of the value of a signal given by the series output of the previous cell 22a to give it to the next cell (in a shifting phase in the register) or to inject it into the line 23, if S2=1, then a stable logic state is held at the input of the storage flip-flop, this state being identical to the state present at the output of this flip-flop. Judiciously S2=1 will be chosen as the default value to control the second multiplexer 28 when the register is not used to inject data elements or to recover sampled data elements.

Similarly, in the case of the first latch, this procedure thus prevents the presence of a floating node at the input of the storage flip-flop, liable to entail power consumption due, for example, to capacitive type leaks at the input transistors of this flip-flop.

The rate of the flip-flop 24 is set by a logic command signal SCKL. Typically, this signal will be given by the test device 16 to control the shifting in the shift register. The command signals HOLD and CLK will be given rather by the control unit 19 inasmuch as they should be synchronous with the internal basic clock signal of the integrated circuit to enable satisfactory sampling. As in the case of the signal SCKL, signals S0, S1 and S2 will be preferably given by the testing device 16 if it is desired to reduce the size of the control unit 19 to the minimum. If, on the contrary, it is desired to minimize the number of pins needed for communication between this unit and the testing device, it will be chosen advantageously to produce them internally to the circuit.

The second latch 26 receives a logic command signal UPDATE for the latching, at its output, of the state of the signal present at its input to the trailing edge of UPDATE for example. As in the case of the other flip-flops, the state of the input of the second latch 26 will be always stable, irrespectively of the state of the command signal UPDATE if S2=1. There are thus averted any leakages which would be possible if the state of this input were to be floating.

The tristate buffer circuit 29 receives a logic command signal ENO. This circuit could be made, for example, by the series-connection of two tristate inverters in such a way that the second one is on if ENO=1 and at high impedance if ENO=0. It is necessary to use a tristate logic circuit so that the signal at the line 23 can change when it is not desired to inject a given value into this line.

Typically, the command signal ENO could be given by the test device 19 so that it is synchronized with the signal SCKL which sets the rate of the shifting in the register.

The cell as described here above has the following advantages:

it can be parallel-connected on one-directional as well as bidirectional lines, it does not induce any delay in the transmission of the signals present in the line 23, it enables sampling without stopping the operation of the circuit and independently of the state of the shift command signal SCKL with respect to the internal clock signal CLOCK, it minimizes the consumption of the cells by keeping the inputs of the different flip-flops in nonfloating states when these flip-flops are insulated from the inputs of the cell.

It is naturally possible to conceive of bus-type cells that are less bulky, for example by:

setting up a direct connection of the parallel input 30 to the 0 input of the second multiplexer, which means that it would be necessary to synchronize the command signal SCKL with the internal clock signal CLOCK or to stop the working of the circuit to ensure the stability of the signal in the line 23 when it is desired to sample its value, being satisfied with just connecting the parallel input 30 to the input of the first latch 25, which is controlled by the command signal HOLD, thus avoiding the above-mentioned drawbacks but accepting the possibility of additional consumption due to possible leakages in the input transistors of this flip-flop when the signal present in the line varies, being satisfied with a second two-input multiplexer, in not looping the output of the storage flip-flop to its input, with the above-mentioned drawbacks.

FIG. 3 shows a one-directional type cell 221 of a standard type to which modifications have been made in accordance with the spirit of the approaches envisaged in the bus-type cell described here above.

This cell 221 has a parallel input 301, a parallel output 321, a series input 311, a series output 331, a storage flip-flop 241 (for example of the master-slave delay type), a first latch 251, a second latch 261, a first two-input multiplexer 271, a second three-input multiplexer 281 and a buffer circuit 291.

The parallel input 301 and the parallel output 321 are not connected, the line 231 being actually separated into two half-lines 231a and 231b respectively connected to the devices of the integrated circuit 100 and 200, these devices being for example a central processing unit and a memory, one of these devices possibly being also an input/output pin of the circuit etc. When a one-directional cell is mounted on an input line of the central processing unit 2, its parallel input 301 is connected to that part of this line which is directed towards the exterior of the central processing unit 2 and its parallel output 321 is connected to that part of this line which is directed towards the interior of the central processing unit 2.

Conversely, when a one-directional cell is mounted on an output line of the central processing unit 2, its parallel input 301 is connected to that part of this line which is directed towards the interior of the central processing unit 2 and its parallel output 321 is connected to that part of this line which is directed towards the exterior of the central processing unit 2.

Herein, the part of the line connected to the parallel input 301 shall be referenced 231a and the part of the line connected to the parallel output 321 shall be referenced 231b.

The one-directional cell 221 has a third two-input multiplexer 341 having a 0 input connected to the parallel input 301, its other 1 input connected to the output of the second latch 261 and one output connected to the input of the buffer circuit 291 whose output is connected to the parallel output 321. This third multiplexer 341 receives a logic command signal MODE in such a way that if MODE=0 then the cell is transparent (Pin=Pout), i.e. the circuit works as if the cell were absent.

If MODE=1, then the parallel output 321 receives the value present at output of the second latch 261 and it is possible to inject a value into the part of the line 231b. Typically, the output circuit 291 will be formed by two series-connected inverters.

The parallel input 301 of the cell 221 is connected to a 0 input of the first multiplexer 271. The series input 311 receives a binary signal Sin coming from a previous cell 221a of the shift register 14 or from the input terminal 16 of the shift register 14. This series input 311 is connected to a 1 input of the second multiplexer 281. The series output 331 is connected to the series input of the next cell 221b or to the output terminal 17 of the register 14 if it is the last cell of the register.

The first multiplexer 271 has one output connected to the input of the first latch 251. This flip-flop 251 has its output connected firstly to a 0 input of the second multiplexer 281 and secondly to a second 1 input of the first multiplexer 271.

The second multiplexer 281 has an output connected to the input of the storage flip-flop 241. This flip-flop 241 has its output connected to the series output 331, to an input 2 of the second multiplexer 281 and to the input of the second latch 261.

The command signals needed to make the cell work are similar to those used for the bus-type cell, except that the command signal ENO has no purpose in the cell 221. Reference shall therefore be made to the description of the bus-type cell as far as these signals are concerned.

With respect to the bus-type cell 22, the one-directional cell 221 has the drawback of delaying the transmission on the line, formed by the line parts 231a and 231b, owing to the presence of the third multiplexer 341 and of the buffer circuit 291. By contrast, it is certain that it is possible to inject a value into the line part 231b without any risk of conflict with a device, if any, that could change the state of the signal in the line part 231a on the parallel input 301 side.

with regard to the approaches, if any, that might make it possible to reduce the space requirements of the cell, reference shall be made to the description of the bus-type cell.

The command signal MODE will preferably be given by the testing device in a manner identical to the command signal ENO of the bus-type cell 22, these two signals having identical aims (activating the injection of a value into the line or insulating the line with respect to the second flip-flop).

Figure 4:
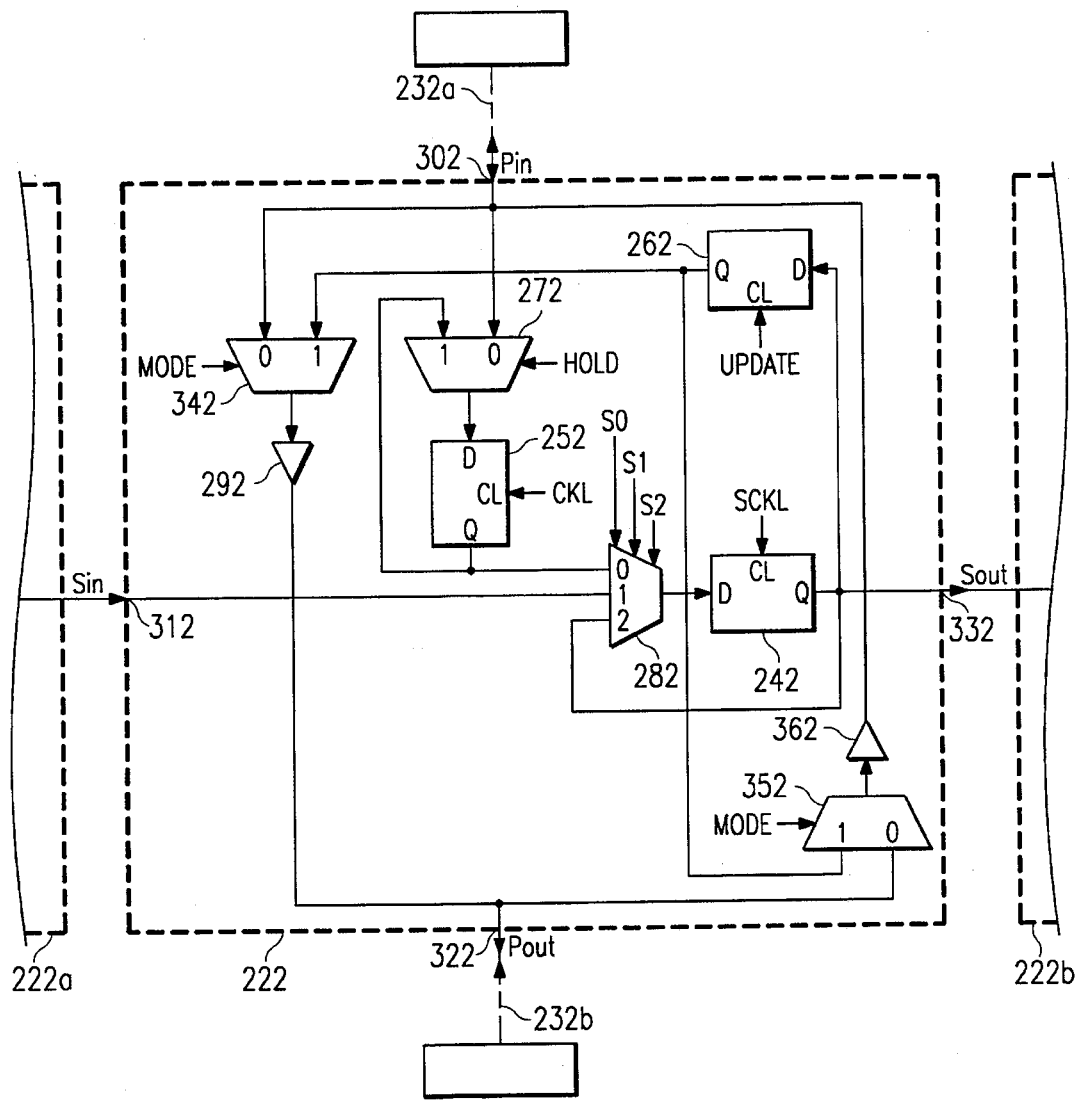

FIG. 4 shows a one-directional type cell 222 of the standard type, to which modifications have been made in accordance with those of the approaches envisaged in the bus-type cell.

This cell 222 has a parallel input 301, a parallel output 322, a series input 312, a series output 332, a storage flip-flop 242 (for example of the master-slave delay type), a first latch 252, a second latch 262, a first two-input multiplexer 272, a second three-input multiplexer 282 and a buffer circuit 292.

The part of the line connected to the parallel input 302 shall be referenced 232a and the part of the line connected to the parallel output 322 shall be referenced 232b.

The bidirectional cell 222 has a third two-input multiplexer 342 having a 0 input connected to the parallel input 302, its other 1 input connected to the output of the second latch 262 and one output connected to the input of tile buffer circuit 292 whose output is connected to the parallel output 322.

The parallel input 302 of the cell 222 is connected to a 0 input of the first multiplexer 272. The series input 312 receives a binary signal Sin coming from a previous cell 222a of the shift register 14 or from the input terminal 16 of the shift register 14. This series input 312 is connected to a 1 input of the second multiplexer 282. The series output 332 is connected to the series input of the next cell 222b or to the output terminal 17 of the register 14 if it is the last cell of the register.

The first multiplexer 272 has one output connected to the input of the first latch 252. This flip-flop 252 has its output connected firstly to a 0 input of the second multiplexer 282 and secondly to a second 1 input of the first multiplexer 272.

The second multiplexer 282 has an output connected to the input of the storage flip-flop 242. This flip-flop 242 has its output connected to the series output 332, to an input 2 of the second multiplexer 282 and to the input of the second latch 262.

The command signals needed to make the cell work are similar to those used for the one-directional cell. Reference shall therefore be made to the description of this cell as far as these signals are concerned.

The parallel output 322 is connected to an input of a fourth two-input multiplexer 352 having its other input connected to the output of the latch 262 and an output connected to the parallel input 302 by means of a second buffer circuit 362 similar to the first output buffer circuit 292. These elements, which are elements additional to those of a one-directional cell, are necessary to permit signal propagation from the parallel output to the parallel input.

A bidirectional cell as defined here above has the same advantages and drawbacks as the one-directional cell described above as regards the characteristics of storage, consumption and propagation time.

It is possible to conceive of making a bidirectional cell that enables the making of a one-directional cell, for example to use it on programmable input/output port lines.

Such a cell is shown in FIG. 5 which repeats the references of FIG. 4.

In the cell of FIG. 5, the circuits used are tristate buffer circuits 292 and 362 controlled by complementary command signals ENO and /ENO so that only one buffer is on at a time. The advantage of this is that it would provide certainty about the direction of propagation of the signal. Depending on the direction chosen and programmed, it is possible to produce suitable command signals for these tristate buffer circuits.

If it is desired that the direction of propagation of the signal should be from the parallel input to the parallel output, it is enough to place the output of the buffer circuit 362 in a state of high impedance to again obtain the arrangement of a standard one-directional cell. If, on the contrary, the desired direction of propagation is from the parallel output to the parallel input, then it is enough to place the buffer circuit 292 in a state of high impedance. The sampling of the value of the signal present in the line 232b will then be placed at the output of the cell (namely at the parallel input). This changes nothing, except that the sampling would be further delayed, the presence of the multiplexer 352 and of the buffer circuit 362 inducing a certain delay in the propagation of the signal.

Another advantage of using bidirectional cells with tristate buffer circuits would be that of proposing only one type of cell that could be used for one-directional propagation lines without any need to pay attention, when these cells are being laid out, to the direction of propagation in order to orient the cell (on the contrary, this direction would have to be known to produce the appropriate command signals ENO and /ENO). This would also simplify the laying out process in the sense that all the series-connected cells on the one-directional and bidirectional lines with programmable directions of propagation would then have identical characteristics (in terms of size, consumption, etc.).

Figure 6:
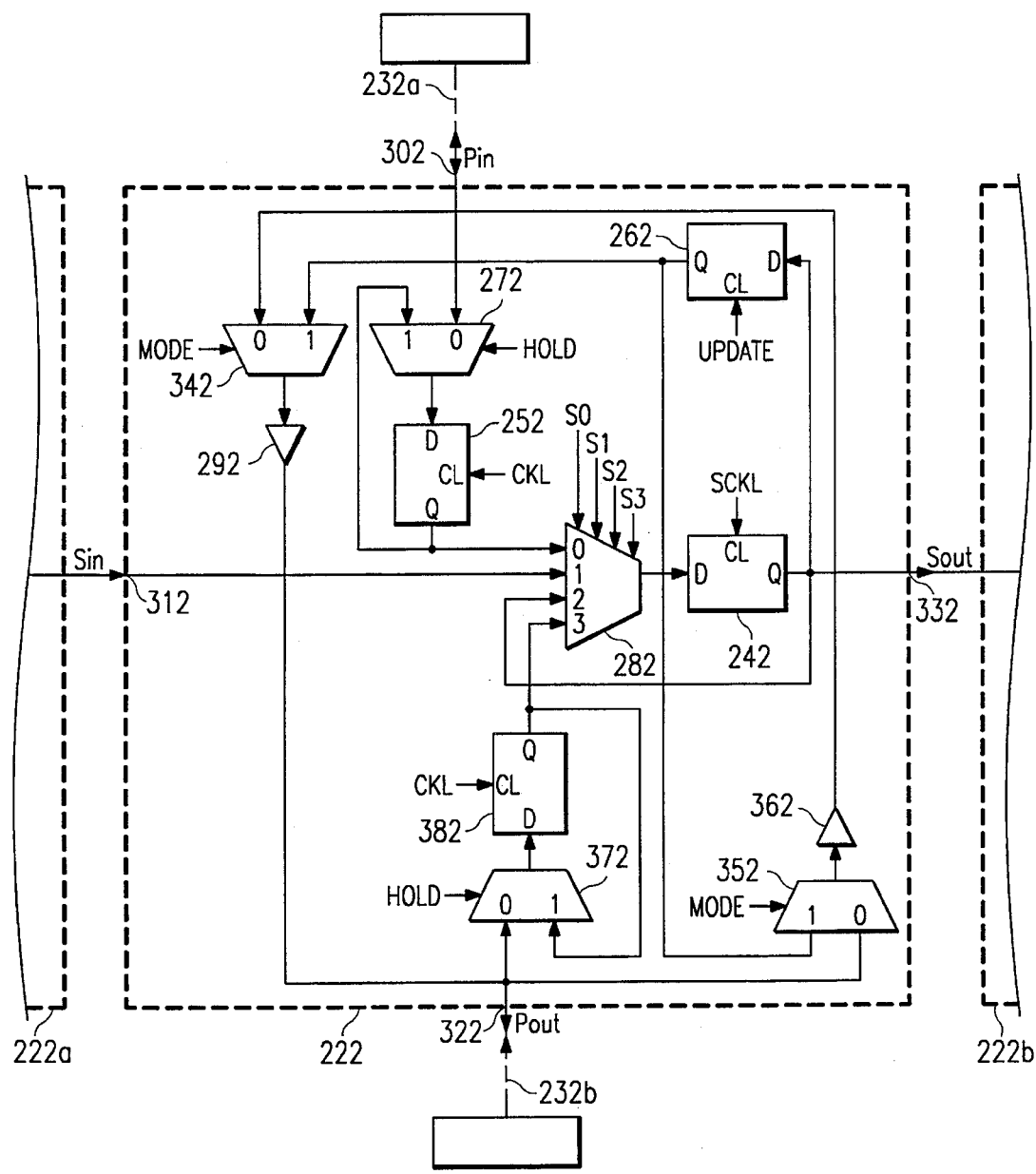

FIG. 6 shows a bidirectional cell identical to that of FIG. 4 apart from the fact that the parallel output 322 is also connected to an input of a fifth two-input multiplexer 372 whose output is connected to the input of a third latch 382, this flip-flop 382 having its output connected to the other input of the fifth multiplexer 372.

The output of the flip-flop 382 is connected to a fourth input of the multiplexer 282 and this multiplexer receives an additional logic command signal S3, given by the testing device 19 so as to be capable of memorizing, in the storage flip-flop 242, both the value of the signal present at the parallel input 302 and the value of the signal present at the parallel output 322.

This cell of FIG. 6 therefore has the same functions as that of FIG. 4.

It nevertheless makes the management of the cell more complex since it is necessary to take account of the fact that it is possible to sample the value of the signal present at the parallel input as well as that of the signal present at the parallel output. In principle, these signals are equal. However, it is possible to conceive of a state where it is desired to sample the value of one of these signals by placing the command signal HOLD at 0 when there is a change in one of these signals.

Figure 7:
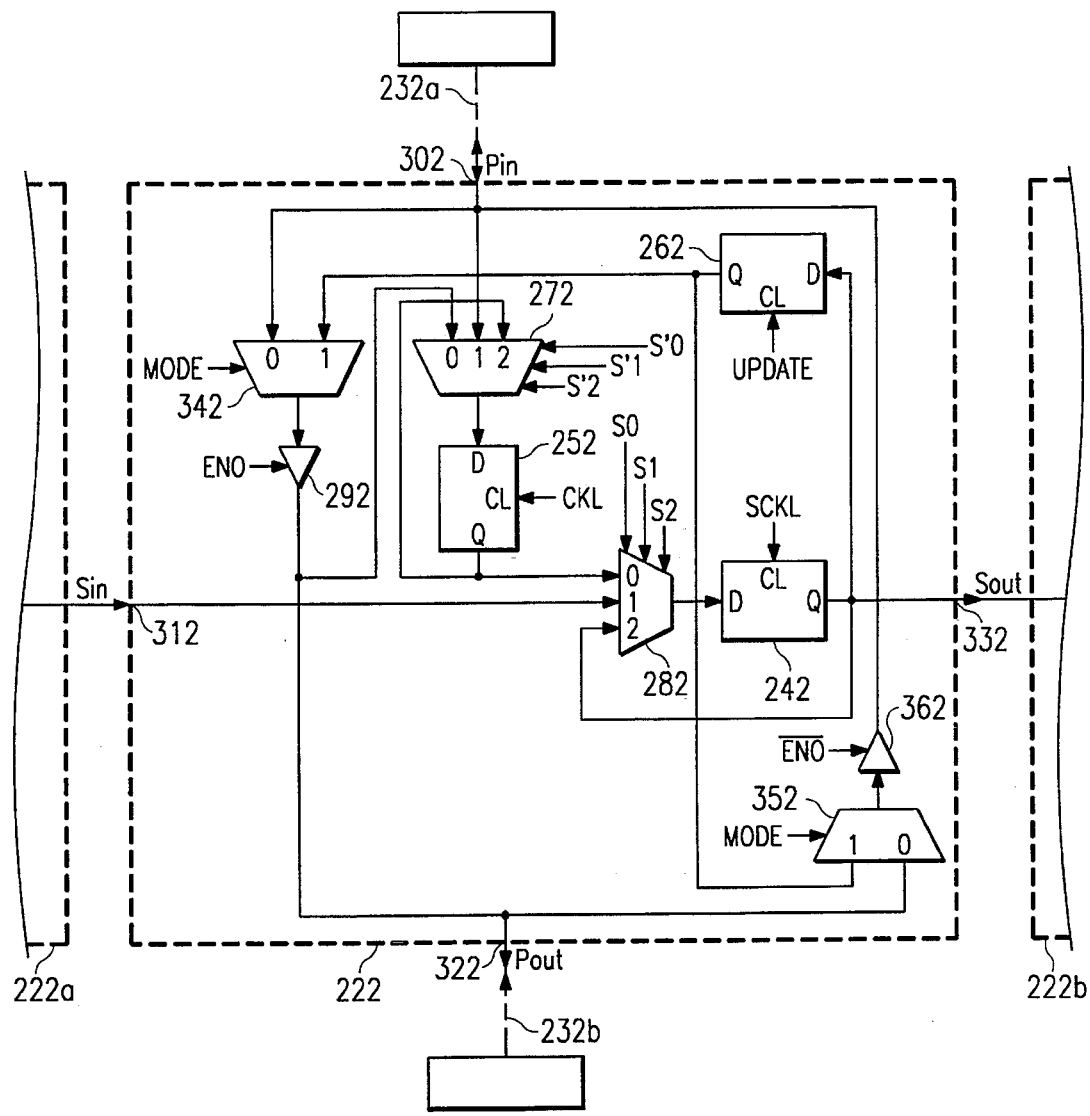

FIG. 7 shows a bidirectional cell identical to that of FIG. 5 apart from the fact that the multiplexer 272 is a three-input multiplexer. This multiplexer receives three logic command signals S'0, S'1 and S'2 to selectively give, at the output of this multiplexer, either the signal present at output of the tristate buffer circuit 292 or the signal present at the parallel input 302 or the signal present at the output of the latch 252.

If these command signals are such that S'=/HOLD./ENO, S'1=/HOLD.ENO, and S'2=HOLD, then the cell of FIG. 7, as compared with that of FIG. 5, has the advantage of permitting the storage, in the latch 252, of the value present in one of the half-lines 232a and 232b while a value is injected into the other half-line.

In the cell of FIG. 5, this was possible only for ENO=1.

Although the invention has been described with reference to preferred exemplary embodiments, it will be understand that these examples are not restrictive and that various modifications can be made thereto without departing from the framework of the invention. Thus, although a description has been given of an exemplary integrated circuit comprising a shift register formed at the inputs/outputs of the central processing unit, it is quite possible to use the cells described here above for an integrated circuit in which a shift register is formed at the inputs/outputs of the circuit.

What is claimed is:

1. A cell for a shift register designed for the injection, into a transmission line, of a binary value or for the sampling of the value of the signal present in said line, this cell comprising:

a parallel input connected to the line to receive a parallel input signal (Pin), a parallel output connected to the line to give a parallel output signal (Pout), a series input to receive a series input signal (Sin) to be shifted into a following cell or to be injected into the line, a series output to give a series output signal (Sour) to a series input of a following cell, wherein the parallel input and the parallel output are connected and wherein the parallel output is separated from the rest of the cell by a tristate buffer circuit.

2. A cell according to claim 1, comprising a first multiplexer receiving the parallel input signal at a first input and the series input signal at a second input, this first multiplexer having an output connected to the input of a storage flip-flop.

3. A cell according to claim 2, wherein the parallel input is connected the input of a latch whose output is connected to the first input of the first multiplexer.

4. A cell according to claim 2, wherein the parallel input is connected to a first input of a second multiplier, this second multiplexer having an output connected to the input of a latch, the output of this latch being connected firstly to the first input of the first multiplexer and, secondly, to a second input of the second multiplexer.

5. A cell according to claim 2, wherein the series output is connected firstly to the output of the storage flip-flop and, secondly, to a third input of the first multiplexer.

6. A cell according to claim 2, wherein the tristate buffer circuit has an input connected to the output of the storage buffer and an output connected to the parallel output.

7. A cell according to claim 2, wherein the tristate buffer has an input connected to the output of a second latch, this second latch having an input connected to the output of the storage flip-flop, and the buffer circuit having an output connected to the parallel output.

8. A cell according to claim 2, wherein the storage flip-flop is a of the master-slave delay circuit type.

9. A cell for a shift register, designed to be series-connection on a transmission line between two devices to inject a binary value into at least one part of the line connected to one of the devices or to sample the value of the signal present in at least a part of the line connected to one of the devices, this cell comprising:

a parallel input connected to a part of the line connected to one of the devices to receive a parallel input signal, a parallel output connected to the part of the line connected to the other device to give a parallel output signal, a series input to receive a series input signal to be shifted in a following cell or to be injected into the line;

a series output to give a series output signal to a series input of a following cell, a first multiplexer receiving the parallel input signal at a first input and the series input signal at a second input, this first multiplexer having an output connected to the input of a storage flip-flop, a second multiplexer receiving, at a first input, the parallel input signal and, at a second input, a signal to be injected into the part of the line to which the parallel output is connected, wherein said cell comprises a first latch receiving the parallel input signal at a first input and having an output connected to the first input of the first multiplexer, and the parallel input is connected to a first input of a third multipexer, this third multiplexer having an output connected to the input of the first latch and a second input connected to the output of this first latch.

10. A cell according to claim 9, wherein the series output is connected firstly to the output of the storage flip-flop and, secondly, to a third input of the first multiplexer.

11. A cell according to claim 9, comprising a fourth multiplexer receiving, at a first input, the parallel output signal and, at a second input, a signal to be injected into the part of the line connected to the parallel input.

12. A cell according to claim 11, wherein the second multiplexer is connected to the parallel output by means of a first tristate buffer circuit and wherein the fourth multiplexer is connected to the parallel input by means of a second tristate output buffer circuit.

13. A cell according to claim 12, wherein an output of the first tristate buffer circuit is connected to a third input of the third multiplexer.

14. A cell according to claim 11, wherein the second inputs of the second multiplexer and of the fourth multiplexer are connected to an output of a second latch whose input ms connected to the storage flip-flop.

15. A cell according to one of the claim 11, comprising a third latch that receives the parallel output signal at one input and has an output connected to a fourth input of the first multiplexer.

16. A cell according to claim 15, comprising a fifth multiplexer having a first input connected the parallel output, a second input connected to the output of the third latch and an output connected to the input of this same latch.

17. A cell according to claim 3, wherein the series output is connected firstly to the output of the storage flip-flop and, secondly, to a third input of the first multiplexer.

18. A cell according to claim 4, wherein the series output is connected firstly to the output of the storage flip-flop and, secondly, to a third input of the first multiplexer.

19. A cell according to claim 3, wherein the tristate buffer circuit has an input connected to the output of the storage buffer and an output connected to the parallel output.

20. A cell according to claim 3, wherein the tristate buffer has an input connected to the output of a second latch, this second latch having an input connected to the output of the storage flip-flop, and the buffer circuit having an output connected to the parallel output.

21. A cell according to claim 3, wherein the storage flip-flop is a of the master-slave delay circuit type.

22. A cell according to claim 4, wherein the tristate buffer circuit has an input connected to the output of the storage buffer and an output connected to the parallel output.

23. A cell according to claim 4, wherein the tristate buffer has an input connected to the output of a second latch, this second latch having an input connected to the output of the storage flip-flop, and the buffer circuit having an output connected to the parallel output.

24. A cell according to claim 4, wherein the storage flip-flop is a of the master-slave delay circuit type.

25. A cell according to claim 9, wherein the series output is connected firstly to the output of the storage flip-flop and, secondly, to a third input of the first multiplexer.

26. A cell according to claim 9, comprising a fourth multiplexer receiving, at a first input, the parallel output signal and, at a second input, a signal to be injected into the part of the line connected to the parallel input.

27. A cell according to claim 12, wherein the second inputs of the second multiplexer and of the fourth multiplexer are connected to an output of a second latch whose input is connected to the storage flip-flop.

28. A cell according to claim 12, comprising a third latch that receives the parallel output signal at one input and has an output connected to a fourth input of the first multiplexer.

29. A cell for a shift register designed for the injection, into a transmission line, of a binary value or for the sampling of the value of the signal present in said line, this cell comprising:

a parallel input connected to the line to receive a parallel input signal, a parallel output connected to the line to give a parallel output signal, a series input to receive a series input signal to be shifted into a following cell or to be injected into the line, a series output to give a series output signal to a series input of a following cell, wherein the parallel input and the parallel output are connected, the parallel output is separated from the rest of the cell by a tristate buffer circuit, and said transmission line is not cut by any element of the cell.

* * * * *